(12) United States Patent
Jiang et al.

(10) Patent No.: US 7,037,756 B1
(45) Date of Patent: May 2, 2006

(54) STACKED MICROELECTRONIC DEVICES AND METHODS OF FABRICATING SAME

(75) Inventors: Tongbi Jiang, Boise, ID (US); Michael Connell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 10/369,849

(22) Filed: Feb. 19, 2003

Related U.S. Application Data

(63) Continuation of application No. 09/943,802, filed on Aug. 30, 2001, now abandoned.

(51) Int. Cl.
*H01L 21/50* (2006.01)
(52) U.S. Cl. ...................................................... 438/109
(58) Field of Classification Search ................ 438/106, 438/109; 257/686
See application file for complete search history.

(56) References Cited

U.S. PATENT DOCUMENTS

| | | |
|---|---|---|
| 5,128,831 A | 7/1992 | Fox, III et al. |
| 5,252,857 A | 10/1993 | Kane et al. |
| 5,323,060 A | 6/1994 | Fogal et al. |
| 5,422,435 A | 6/1995 | Takiar et al. |
| 5,518,957 A | 5/1996 | Kim |
| 5,883,426 A | 3/1999 | Tokuno et al. |
| 5,904,497 A | 5/1999 | Akram |
| 5,926,951 A | 7/1999 | Khandros et al. |
| 5,946,553 A | 8/1999 | Wood et al. |
| 5,952,725 A | 9/1999 | Ball |
| 5,986,209 A | 11/1999 | Tandy |
| 5,990,566 A | 11/1999 | Farnworth et al. |
| RE36,469 E | 12/1999 | Wood et al. |
| 6,020,624 A | 2/2000 | Wood et al. |
| 6,020,629 A | 2/2000 | Farnworth et al. |
| 6,028,365 A | 2/2000 | Akram et al. |
| RE36,613 E | 3/2000 | Ball |
| 6,051,878 A | 4/2000 | Akram et al. |
| 6,072,233 A | 6/2000 | Corisis et al. |
| 6,072,236 A | 6/2000 | Akram et al. |
| 6,084,308 A | 7/2000 | Kelkar et al. |
| 6,137,163 A | 10/2000 | Kim et al. |
| 6,153,924 A | 11/2000 | Kinsman |
| 6,160,718 A | 12/2000 | Vakilian |
| 6,165,815 A | 12/2000 | Ball |
| 6,175,149 B1 | 1/2001 | Akram |
| 6,176,966 B1 | 1/2001 | Tsujimoto et al. |
| 6,212,767 B1 | 4/2001 | Tandy |
| 6,225,194 B1 | 5/2001 | Noguchi et al. |
| 6,225,689 B1 | 5/2001 | Moden et al. |
| 6,228,548 B1 | 5/2001 | King et al. |
| 6,235,554 B1 | 5/2001 | Akram et al. |

(Continued)

OTHER PUBLICATIONS

Baikerikar, K.K. and A.B. Scranton, "Photopolymerizable liquid encapsulants for microelectronic devices," Polymer, vol. 42, Issue 42, pp. 431-441, Jan. 2001, Elsevier Science Ltd., Amsterdam.

(Continued)

*Primary Examiner*—Scott Geyer
(74) *Attorney, Agent, or Firm*—Perkins Coie LLP

(57) ABSTRACT

Certain methods of the invention permit spacerless manufacture of stacked microelectronic devices by mechanically supporting a second microelectronic component with a wire coating. This wire coating may be sufficiently adhesive to also mechanically bond the second microelectronic component to a first microelectronic component. Other embodiments of the invention provide spacerless stacked microelectronic devices wherein a second microelectronic component is mechanically supported by a wire coating.

38 Claims, 6 Drawing Sheets

U.S. PATENT DOCUMENTS

| | | | |
|---|---|---|---|
| 6,258,623 | B1 | 7/2001 | Moden et al. |
| 6,261,865 | B1 | 7/2001 | Akram |
| 6,262,895 | B1 | 7/2001 | Forthun |
| 6,281,577 | B1 | 8/2001 | Oppermann et al. |
| 6,294,839 | B1 | 9/2001 | Mess et al. |
| 6,297,547 | B1 | 10/2001 | Akram |
| 6,303,981 | B1 | 10/2001 | Moden |
| 6,338,984 | B1 | 1/2002 | Minamio et al. |
| 6,340,846 | B1 * | 1/2002 | LoBianco et al. ........... 257/783 |
| 6,344,976 | B1 | 2/2002 | Schoenfeld et al. |
| 6,351,028 | B1 | 2/2002 | Akram |
| 6,387,728 | B1 * | 5/2002 | Pai et al. ................... 438/106 |
| 6,388,313 | B1 * | 5/2002 | Lee et al. ................... 257/686 |
| 6,400,007 | B1 | 6/2002 | Wu et al. |
| 6,500,698 | B1 * | 12/2002 | Shin ........................... 438/112 |
| 6,514,795 | B1 | 2/2003 | Jiang et al. |
| 6,521,881 | B1 * | 2/2003 | Tu et al. ................... 250/208.1 |
| 6,531,784 | B1 * | 3/2003 | Shim et al. ................. 257/777 |
| 6,545,365 | B1 * | 4/2003 | Kondo et al. ............... 257/777 |
| 6,552,910 | B1 | 4/2003 | Moon et al. |
| 6,558,975 | B1 | 5/2003 | Sugino et al. |
| 6,559,526 | B1 * | 5/2003 | Lee et al. ................... 257/676 |
| 6,560,117 | B1 | 5/2003 | Moon |
| 6,569,709 | B1 * | 5/2003 | Derderian ................... 438/109 |
| 6,620,649 | B1 | 9/2003 | Uchida |
| 6,657,290 | B1 * | 12/2003 | Fukui et al. ................ 257/686 |
| 6,683,385 | B1 * | 1/2004 | Tsai et al. ................... 257/777 |
| 6,706,557 | B1 | 3/2004 | Koopmans |
| 6,713,856 | B1 * | 3/2004 | Tsai et al. ................... 257/686 |
| 2002/0096754 | A1 * | 7/2002 | Chen et al. ................. 257/686 |
| 2002/0096761 | A1 * | 7/2002 | Chen et al. ................. 257/723 |
| 2002/0109216 | A1 * | 8/2002 | Matsuzaki et al. .......... 257/686 |
| 2003/0038355 | A1 * | 2/2003 | Derderian ................... 257/686 |
| 2003/0107138 | A1 | 6/2003 | Tian et al. |
| 2003/0127719 | A1 * | 7/2003 | Chang ........................ 257/685 |
| 2003/0162325 | A1 | 8/2003 | Tan et al. |
| 2003/0176018 | A1 * | 9/2003 | Derderian ................... 438/109 |
| 2003/0178715 | A1 | 9/2003 | Sturcken et al. |
| 2004/0157375 | A1 * | 8/2004 | Derderian ................... 438/118 |

OTHER PUBLICATIONS

Chylak, B. et al., "Overcoming the Key Barriers in 35 μm Pitch Wire Bond Packaging: Probe, Mold, and Substrate Solutions and Trade-offs," SEMICON® West 2002 SEMI® Technology Symposium: International Electronics Manufacturing Technology (IEMT) Symposium, Jul. 17-18, 2002, San Jose, California. <http://www.kns.com/RESOURCES/ARTICLES/35um_wirebonding.pdf>.

Hmiel, A.F. et al., "A Novel Process for Protecting Wire Bonds From Sweep During Molding," SEMICON® West 2002 SEMI® Technology Symposium: International Electronics Manufacturing Technology (IEMT) Symposium, Jul. 17-18, 2002, San Jose, California. <http://www.kns.com/RESOURCES/ARTICLES/Hmiel_IEMT_02.pdf>.

Kulicke & Soffa Industries Inc., Preliminary Technical Data Sheet, "No Sweep" Wire Bond Encapsulant EW707-002.

Kulicke & Soffa, "NoSWEEP Encapsulant," "'NoSWEEP' BGA Encapsulation Process," "Wire Bond Encapsulant Dispense/Gel," "NoSag with NoSWEEP Wire Encapsulant," "'NoSWEEP' Test Status," "'NoSWEEP' Customer Test," "'NoSWEEP' Yield Benefit," "NoSWEEP Creative Applications," "NoSWEEP Encapsulant" Preliminary Technical Data.

Kulicke & Soffa, "Polymers. NoSweep® Wire Bond Encapsulant," 1 page, retrieved from the Internet on Nov. 14, 2002, <http://www.kns.com/prodserv/Polymers/nosweep.asp>.

AI Technology, UV Releasing Tape, "Dicing & Lapping Tapes for Wafer and Substrate," <http://www.aitechnology.com/dicingtape/prod03_uv_release_dice.htm>, 3 pages, Nov. 12, 2001.

Lintec-USA, UV Curable Adhesive, <http://www.lintec-usa.com/Contents/Products/Tape/Uvad.htm>, 3 pages, Nov. 12, 2001.

* cited by examiner

STACKED MICROELECTRONIC DEVICES AND METHODS OF FABRICATING SAME

CROSS REFERENCE TO RELATED APPLICATION

This application is a continuation of U.S. patent application Ser. No. 09/943,802 entitled "STACKED MICROELECTRONIC DEVICES AND METHODS OF FABRICATING SAME," filed on Aug. 30, 2001, now abandoned, which application is hereby incorporated by reference in its entirety.

TECHNICAL FIELD

The present invention relates to an apparatus and method for increasing microelectronic device density. The invention has particular utility in connection with producing vertically superimposed, multi-component microelectronic devices in which at least one of the devices is wire-bonded to a substrate.

BACKGROUND

Higher performance, lower cost, increased miniaturization of components, and greater packing density of integrated circuits are ongoing goals of the computer industry. Greater integrated circuit density is primarily limited by the space or "real estate" available for mounting microelectronic components on a substrate such as a printed circuit board. The microelectronic component may be electrically connected to circuitry on the circuit board via flip chip attachments, wirebonding, tape automated bonding (TAB), or a variety of other techniques.

Increasingly, microelectronic components are being vertically stacked atop one another to conserve valuable substrate real estate. In such a vertically stacked assembly, a first microelectronic component is attached directly to the substrate and a second microelectronic component may be physically attached to the first microelectronic component (e.g., stacked on the first microelectronic component). If the first microelectronic component is electrically connected to the substrate via flip chip attachments or TAB, the active surface of the microelectronic component (i.e., the surface bearing the electrical contacts for connection to the circuitry of the microelectronic component) faces toward the substrate. Commonly, the bare backside surface of the first microelectronic component is exposed and faces away from the substrate, and the second microelectronic component is attached directly to the backside surface.

If the first microelectronic component is electrically connected to the substrate by wire bonding, however, attachment of the second microelectronic component to the first microelectronic component can be more problematic. In wire-bonding techniques, the backside of the first microelectronic component is mounted to the substrate and the active surface of a wire-bonded microelectronic component defines the outer surface which faces away from the substrate. The contacts on the active surface are then electrically coupled to the contacts on the substrate by very small conductive wires that extend from the active surface to the substrate. The wires that electrically connect the active surface of the microelectronic component to the substrate accordingly interfere with attaching the second microelectronic component directly on the active surface. FIGS. 1 and 2 schematically illustrate two techniques currently used to bond a second microelectronic device to a first microelectronic device which is wire-bonded to the substrate.

FIG. 1 illustrates a substrate 20 carrying a pair of microelectronic devices 30, 40. The substrate 20, which may be a circuit board or the like, has a contact surface 24 bearing a plurality of electrical contacts 26a–26d. A first microelectronic component 30 is attached to the component surface 24 of the substrate 20 by means of an adhesive 35. The adhesive 35 may cover the entire mounting face 32 of the first microelectronic component 30. The active surface 34 to the first microelectronic component 30 includes a plurality of electrical contacts 36a–36b. A first bonding wire 38a electrically connects the first electrical contact 36a of the first microelectronic component 30 to the first electrical contact 26a of the substrate 20, and a second bonding wire 38b electrically connects a second electrical contact 36b of the first microelectronic component 30 to a second electrical contact 26b of the substrate 20.

The second microelectronic component 40 is carried by the first microelectronic component 30. In some conventional stacked microelectronic devices, a facing surface 42 of the second microelectronic component is attached to the active surface 34 of the first microelectronic component 30 via a single, thick adhesive layer (not shown). This adhesive layer conventionally has a thickness which is greater than the height to which the bonding wires 38 extend above the active surface 34 so the second microelectronic device 40 does not directly contact or rest against the bonding wires 38. Such a structure is shown in U.S. Pat. No. 5,323,060, the entirety of which is incorporated herein by reference. In the embodiment shown in FIG. 1, a separate spacer 50 is positioned between the first and second microelectronic components 30 and 40. This spacer 50 is attached to the active surface 34 of the first microelectronic component 30 via one adhesive layer 52 and is attached to the facing surface 42 of the second microelectronic component 40 by another adhesive layer 54. The spacer 50 is commonly either a polymeric tape or a thin silicon wafer. Once the second microelectronic device 40 is in place, a first electrical contact 46a on the outer surface 44 of the second microelectronic component 40 can be electrically connected to a third electrical contact 26c carried by the substrate 20. Similarly, a second electrical contact 46b on the outer surface 44 can be electrically connected to a fourth electrical contact 26d carried by the substrate 20.

A stacked microelectronic device such as that shown in FIG. 1 can present some manufacturing difficulties. For example, rapidly and precisely positioning the spacer 50 and adhesive layers 52, 54 can be a challenge. Even if the stacked microelectronic device is properly assembled initially, the multiple layers of different materials can lead to product defects. If the second microelectronic component 40 is attached to the first microelectronic component 30 by a single, thick adhesive layer (not shown), any difference in the coefficient of thermal expansion between the adhesive layer and the microelectronic components 30 and 40 can cause deleterious warping of the microelectronic components 30 and 40. If a polymeric tape is used as the spacer 50 shown in FIG. 1, differences in the coefficients of thermal expansion can still lead to warping of the microelectronic components 30 and 40 during subsequent thermal processing. If the microelectronic components 30 and 40 are silicon-based dies, the use of a silicon spacer 50 can reduce the problems associated with differences in coefficients of thermal expansion. However, the different coefficient of thermal expansion of the adhesive layers 52 and 54 can still induce some stress in the microelectronic components 30 and 40. In addition, the structure shown in FIG. 1 has four separate interfaces between the first and second microelectronic components 30 and 40, namely the interface between the active surface 34 of the first microelectronic component 30 and the adhesive layer 52; the interface between the adhesive layer 52 and the spacer 50; the interface between the spacer 50 and the adhesive layer 54; and the interface between the adhesive layer 54 and the facing surface 42 of the second microelectronic component 40. Each additional interface increases the number of manufacturing steps, necessitating more manufacturing time and/or equipment, and heightens the risk of producing an unacceptable stacked microelectronic device. Spacers also increase the size of the final stacked microelectronic device, with both silicon and polymer spacers having typical thicknesses on the order of 6 mils.

FIG. 2 schematically illustrates another conventional stacked microelectronic device. Instead of having a thick adhesive layer or a spacer 50 between the first and second microelectronic components 30 and 40, the second microelectronic component 40 may be attached to the active surface 34 of the first microelectronic component 30 is using a relatively thin adhesive layer 55. To avoid interference with the bonding wires 38, however, the second microelectronic component 40 is significantly smaller than the first microelectronic component 30. While this avoids direct physical contact between the second microelectronic component 40 and the bonding wires 38, it significantly limits the size of the second microelectronic component 40. Although the stacked microelectronic device of FIG. 2 can be made shorter than the stacked device of FIG. 1, the smaller size of the second microelectronic component 40 reduces the number of integrated circuits which can be incorporated in the second microelectronic component 40 and, hence, the stacked microelectronic device.

SUMMARY OF THE INVENTION

Embodiments of the present invention provide stacked microelectronic devices and method for manufacturing stacked microelectronic devices. In certain embodiments, a second microelectronic component is mechanically supported with respect to the first microelectronic component without requiring a thick spacer layer therebetween or necessitating that the second microelectronic component be materially smaller than the first microelectronic component.

In one embodiment, the invention provides a method of assembling a stacked microelectronic device assembly. In accordance with this embodiment, a first microelectronic component is attached to a support. A first electrical contact carried by the support is wirebonded to a second electrical contact carried by the first microelectronic component using a first bonding wire. At least a portion of the first bonding wire is covered with a wire coating which has an exposed upper surface. The upper surface of the wire coating may contact a second microelectronic component, with the wire coating mechanically bonding the second microelectronic component to the first microelectronic component. A third electrical contact carried by the second microelectronic component may be electrically connected to a fourth electrical contact carried by the substrate. If so desired, the fourth electrical contact may be the same as the first electrical contact, i.e., the second and third electrical contacts may be electrically connected to the same electrical contact on the substrate.

In accordance with a further embodiment of the invention, a method of assembling a stacked microelectronic device assembly may include attaching a first microelectronic component to a support with an active surface of the first microelectronic component facing away from a contact surface of the support. The support may include a plurality of first electrical contacts and the first microelectronic component may include a plurality of second electrical contacts. A first wire may be electrically connected to a first one of the first electrical contacts and to a first one of the second electrical contacts. A second wire may be electrically connected to a second one of the first electrical contacts and to a second one of the second electrical contacts, with the first wire being spaced from the second wire. A wire coating may be disposed on at least a portion of the first wire and at least a portion of the second wire. At least a portion of a second microelectronic component may be placed proximate to the active surface of the first microelectronic component such that the wire coating mechanically supports the second microelectronic component and defines an intercomponent gap between a facing surface of the second microelectronic component and the active surface of the first microelectronic component. In one further aspect of this embodiment, the first and second microelectronic components may be encapsulated in an encapsulant. This encapsulant may be permitted to flow into the intercomponent gap.

In certain embodiments of the invention, the wire coating may be applied in an initial uncured state and may be partially cured to yield an adhesive, mechanically stable wire coating. Thereafter, the second microelectronic component may be brought into contact with the adhesive, mechanically stable wire coating whereby the wire coating can both mechanically support the second microelectronic component and bond the second microelectronic component to the first microelectronic component. If so desired, the partially cured wire coating may then be further cured.

Another embodiment of the invention provides a stacked microelectronic device which comprises a support carrying a plurality of first contacts. A first microelectronic component may be carried by the support, with the first microelectronic component comprising an active surface bearing a plurality of second contacts. A first bonding wire may electrically connect a first one of the first contacts to a first one of the second contacts. A wire coating may cover at least a portion of the first bonding wire. A second microelectronic component may comprise a facing surface and an outer surface, with the outer surface bearing a plurality of third contacts. The facing surface is juxtaposed with the active surface of the first microelectronic component and the wire coating mechanically supports the second microelectronic component to define an intercomponent gap between the facing surface and the active surface. If so desired, the intercomponent gap may be filled with a second material having a composition different from the composition of the wire coating. The second material may, for example, be an encapsulant such an epoxy resin or a silicone material.

DETAILED DESCRIPTION

Figure 1:
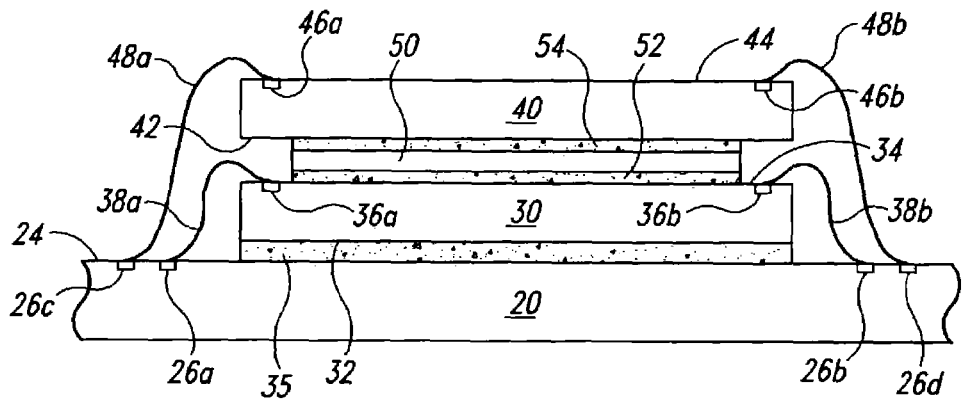
FIG. 1 is a schematic view of one conventional stacked microelectronic device employing a spacer between the microelectronic components.

Various embodiments of the present invention provide stacked microelectronic devices and methods of manufacturing stacked microelectronic devices. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

Figure 2:
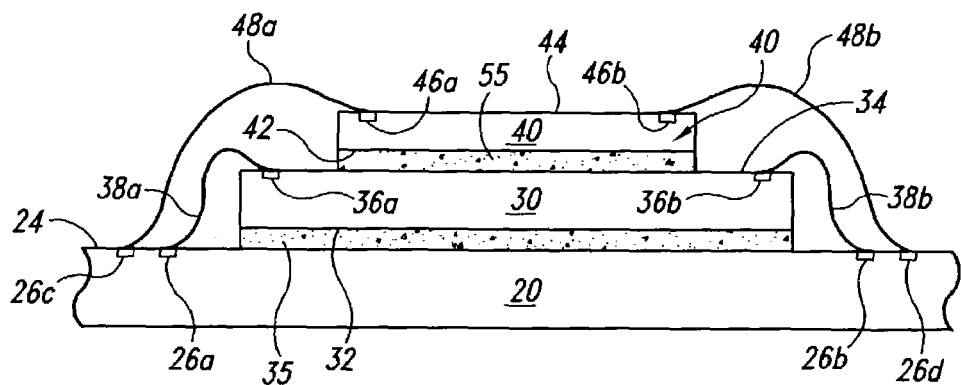
FIG. 2 is a schematic view of another conventional stacked microelectronic device wherein the second microelectronic device is smaller than the first microelectronic device.

Embodiments of the present invention provide stacked microelectronic devices which include a substrate 20 and at least first and second microelectronic components. The microelectronic components are supported in a novel and beneficial manner, but stacked microelectronic devices in accordance with embodiments of the present invention may employ some of the same components used in the conventional stacked microelectronic devices shown in FIGS. 1 and 2. Accordingly, like reference numbers have been used in FIGS. 1–6 to indicate like components.

Figure 3A:
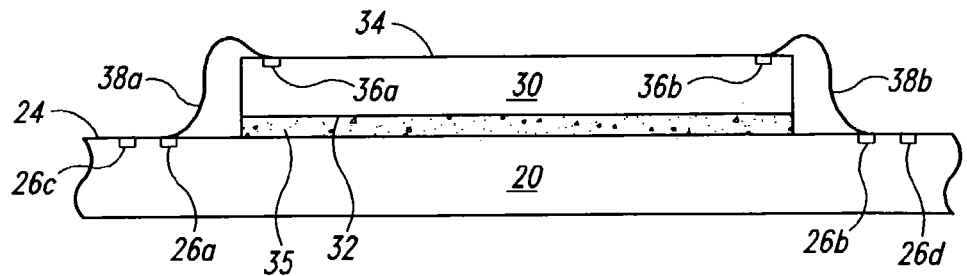
FIGS. 3A–3C schematically illustrate sequential stages in a method of manufacturing a stacked microelectronic device in accordance with one embodiment of the invention.
Figure 3B:
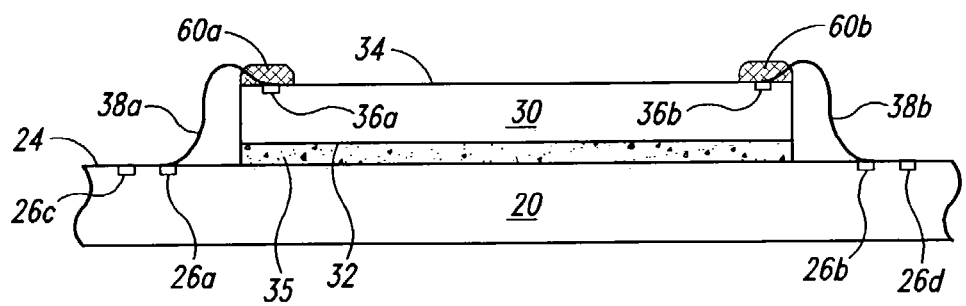
Figure 3C:
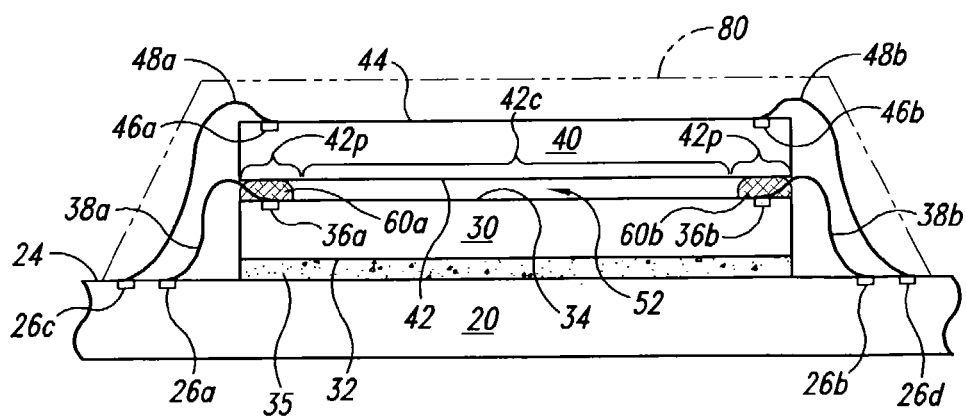

FIGS. 3A–3C schematically illustrate stages in the manufacture of a stacked microelectronic device in accordance with one embodiment of the invention. The substrate 20 shown in FIG. 3A is provided with a plurality of first electrical contacts 26a–26d on its contact surface 24. The substrate 20 may be flexible or rigid and have any desired configuration. The substrate 20 may be formed of materials commonly used in microelectronic substrates, such as ceramic, silicon, glass, or combinations thereof. The substrate 20 can alternatively be formed of an organic material or other materials suitable for printed circuit boards (PCBs). In one embodiment of the invention, the substrate 20 comprises a printed circuit board such as an FR-4 PCB.

The first microelectronic component 30 has a mounting surface 32 (i.e., backside) and an active surface 34 (i.e., front side) bearing a plurality of second electrical contacts 36a–b. The first microelectronic component 30 may be SIMM, DRAM, flash-memory, a processor, or any of a variety of other types of microelectronic devices. Typically, the first microelectronic component 30 is a silicon die carrying an integrated circuit. Although the first microelectronic component 30 is illustrated in the drawings as being a single element, it should be understood that the first microelectronic component 30 can comprise any number of subcomponents.

The first microelectronic component 30 may be attached to the substrate 20 in any desired fashion. In one embodiment, the first microelectronic component 30 is attached to the contact surface 24 of the substrate 20 by an adhesive 35. The adhesive 35 may be an epoxy, a thermoplastic material, a polymeric tape, a polymeric tape coated with thermoplastic materials, or any other conventional adhesive or cementitious material compatible with the materials of the substrate 20 and first microelectronic component 30 and stable in the anticipated conditions of use.

After the first microelectronic component 30 is attached to the substrate 20, the microelectronic component 30 may be electrically connected to the substrate 20. In the illustrated embodiment, each of the second electrical contacts 36 of the first microelectronic component 30 is separately connected to a different one of the first electrical contacts 26 of the substrate 20. In particular, a first bonding wire 38a is electrically connected to electrical contact 26a carried by the substrate 20 and to electrical contact 36a carried by the first microelectronic component 30. Similarly, a second bonding wire 38b electrically connects electrical contact 26b carried by the substrate 20 to electrical contact 36b carried by the first microelectronic component 30. The bonding wires 38 may be applied using conventional wire bonding equipment such as that available from Kulicka & Soffa Industries, Inc. of Willow Grove, Pa., USA.

At least a portion of each of the bonding wires 38 may be coated with a first wire coating 60. In the illustrated embodiment, a wire coating segment 60a coats electrical contact 36a of the first microelectronic component 30 and an adjacent length of the first bonding wire 38a. The remainder of the first bonding wire 38a and the electrical contact 26a to which the first bonding wire 38a is attached can remain exposed, such that it is not covered by the wire coating 60a. Similarly, wire coating segment 60b covers electrical contact 36b and an adjacent length of the second bonding wire 38b, but the rest of the second bonding wire 38b and the other electrical contact 26b to which it is connected remain exposed. The two wire coating segments 60a–b are shown as being two discrete coatings. It should be understood, however, that the wire coating segments 60a–b may be part of a single, continuous wire coating 60. For example, the wire coating 60 may extend around a periphery of the first microelectronic component 30 and cover any number of electrical contacts 36 and bonding wires 38. In other applications, it may be desirable to apply two or more discrete wire coating segments but some or all of the wire coating segments may cover more than one electrical contact 36 and more than one associated bonding wire 38. For example, the electrical contacts 36 may be arranged in two generally parallel rows extending adjacent opposite edges of the first microelectronic component 30, with the wire coating segments 60a–b being applied as two discrete, elongate beads, each of which covers one row of electrical contacts 36. If so desired, the shape and position of the wire coating 60 may be controlled using a mold, a dam or other structure.

For reasons explained below, the wire coating 60 should be sufficiently mechanically stable to mechanically support the second microelectronic component 40. The wire coating 60 need not be rigid to provide the requisite mechanical support. Instead, a relatively viscous wire coating 60 may be sufficiently strong to support the second microelectronic component 40 during subsequent manufacturing steps.

In one embodiment of the invention, the wire coating 60 is both mechanically stable and can serve as an adhesive to bond the second microelectronic component 40 to the first microelectronic component 30 without need of any other adhesive. If so desired, this combination of properties may be accomplished by applying the wire coating 60 and subsequently treating the wire coating 60, such as by chemically treating an exterior surface of the wire coating 60 to cause it to adhere to the second microelectronic component 40. More preferably, though, the material of the wire coating 60 is selected to be both sufficiently mechanically stable to support the second microelectronic component 40 and provide a sufficiently adhesive surface to adhere the second microelectronic component 40 without any further surface treatments.

In one particular embodiment of the invention, the wire coating 60 is a curable thixotropic material. Thixotropic materials tend to have quite high viscosities and may behave much like a solid in the absence of shear, but can be "liquefied" when shaken to significantly reduce viscosity. When shaking ceases, the thixotropic material will tend to return to its mechanically stable, high-viscosity state.

The wire coating 60 may be a multi-component coating which can be cured from an initial state adapted for application using automated equipment to a final state better suited for use or further manufacturing steps. Such a wire coating 60 may be cured in any suitable fashion such as by heat treatment or exposure to ultraviolet radiation. In one specific embodiment, the wire coating 60 is relatively tacky or adhesive when first applied, but may harden and become less adhesive as it is cured. Those skilled in the field should be able to identify or develop suitable curable, thixotropic coatings without undue experimentation. Kulicka & Soffa Industries, Inc. is also promoting such coatings for use in wire bonding applications under the tradename NOSWEEP, e.g., as product number EW707-002.

In accordance with one embodiment of the invention, the wire coating 60 is applied as shown in FIG. 3B and is partially cured, e.g., by heat treatment or exposure to ultraviolet radiation, but for a time or at conditions which are insufficient to fully cure the material of the coating. This partial curing may enhance the mechanical stability of the wire coating 60 while leaving the wire coating 60 sufficiently adhesive to permit the second microelectronic component 40 to adhere thereto, at least during further manufacture if not also during use.

The wire coating 60 may be electrically insulative and it may have a coefficient of thermal expansion similar to that of the first and/or second microelectronic components 30, 40. If an encapsulant 80 (discussed below) is employed, the wire coating 60 and the encapsulant may be selected to have a similar coefficient of thermal expansion. Conductivity and other properties may be adjusted by fillers incorporated into the matrix of the wire coating 60. For instance, metal fillers provide enhanced electrical conductivity and thermal dissipation. Dielectric fillers such as fused silica can reduce conductivity and may provide a coefficient of thermal expansion closer to that of the microelectronic component, e.g., a silicon die.

After the wire coating 60 is applied to the bonding wires 38 and, if so desired, partially or wholly cured, the facing surface 42 of the second microelectronic component 40 may be juxtaposed with the active surface 34 of the first microelectronic component 30 and the facing surface 42 of the second microelectronic component 40 is brought into contact with the wire coating 60. The wire coating 60 is sufficiently mechanically stable to mechanically support the second microelectronic component 40 with respect to the first microelectronic component 30. Desirably, the exposed upper surface of the wire coating 60 is sufficiently adhesive to cause the second microelectronic component 40 to adhere thereto. This mechanically bonds the second microelectronic component 40 to the first microelectronic component 30.

As noted above, the wire coating 60 may be applied as two or more discrete wire coatings 60a–b. In the illustrated embodiment, the first bonding wire 38a and its associated wire coating 60a is spaced from the second bonding wire 38b and its associated coating 60b. As shown in FIG. 3C, when discrete wire coating portions 60a and 60b mechanically support the second microelectronic component 40, an intercomponent gap 52 may be defined between the active surface 34 of the first microelectronic component 30 and the facing surface 42 of the second microelectronic component 40. In the illustrated embodiment, this intercomponent gap 52 may be exposed to the ambient atmosphere.

In the embodiment of FIG. 3C, only a portion of the facing surface 42 of the second microelectronic component 40 is covered by contact with the wire coating 60. The remainder of the facing surface 42 remains exposed to the intercomponent gap 52. Where the first and second microelectronic components 30 and 40 are similar in dimensions, a central portion 42c of the facing surface 42 may be exposed to the intercomponent gap 52 while only a peripheral portion 42p of the facing surface 42 is in direct contact with the wire coating 60.

As noted above, in accordance with one method of the invention the wire coating 60 is partially cured before the second microelectronic component 40 is brought into contact with the wire coating 60. In such an embodiment, the wire coating 60 in FIG. 3C may be further cured. This may enhance the mechanical support of the second microelectronic component 40 and may further mechanically bond the second microelectronic component 40 to the first microelectronic component 30.

Like the first microelectronic component 30, the second microelectronic component 40 can be any of a variety of microelectronic devices, including SIMM, DRAM, flash-memory, or processors. The second microelectronic component 40 is shown as being a single element, but it could comprise any number of subcomponents. The first and second microelectronic components 30 and 40 may be the same type of microelectronic components or they may be different types of components. For example, both of the microelectronic components 30 and 40 may comprise memory modules, such as DRAMs.

The second microelectronic component 40 may have any suitable size. As noted above in connection with FIG. 2, if a relatively thin adhesive layer 55 is used to bond the second microelectronic component 40 to the first microelectronic component 30 in conventional stacked microelectronic devices, the second microelectronic component 40 commonly is smaller than the first microelectronic component 30 upon which it rests. This is necessary to ensure that the electrical contacts 36 and the bonding wires 38 remain exposed and are not damaged by contact with the second microelectronic component 40.

If so desired, the second microelectronic component 40 in the present invention may be smaller than the first microelectronic component 30. The methods and devices in accordance with the present invention are not so limited, however. In the embodiment shown in FIG. 3C, the first and second microelectronic components 30 and 40 are approximately the same size and the second microelectronic component 40 is superimposed over the first microelectronic component 30. The wire coating 60 may serve to both mechanically support the second microelectronic component 40 and to protect the bonding wires 38. This permits the second microelectronic component 40 to directly overlie the bonding wires 38. As a consequence, the second microelectronic component 40 may be larger than the first microelectronic component 30 or otherwise cover any portion of the bonding wires 38 and their associated electrical connections 36 on the first microelectronic component 30.

The second microelectronic component 40 may be electrically connected to the substrate 20 in any desired fashion. In one embodiment, the second microelectronic component 40 has an outer surface 44 carrying a plurality of third electrical contacts 46 which may be electrically connected to the first electrical contacts 26 carried by the substrate 20. In the particular embodiment shown, a third bonding wire 48a electrically connects an electrical contact 46a carried by the second microelectronic component 40 to electrical contact 26c carried by the substrate 20. Similarly, a fourth bonding wire 48b electrically connects an electrical contact 46b carried by the second microelectronic component 40 to electrical contact 26d carried by the substrate 20. Each of the bonding wires 38, 48 are shown as connecting one electrical contact 36 or 46 carried by one of the microelectronic components 30 or 40 to a different one of the electrical contacts 26 carried by the substrate 20. It should be understood, however, that this need not be the case. For example, the third bonding wire 48a may connect the electrical contact 46a of the second microelectronic component 40 to the electrical contact 26a on the substrate 20 to which the second bonding wire 38a had already been attached and the fourth bonding wire 48b may similarly connect electrical contact 46b of the second microelectronic component 40 to electrical contact 26b on the substrate 20.

If so desired, the first and second microelectronic components 30 and 40 may be encapsulated within an encapsulant 80. The encapsulant 80 may have a composition which is the same as or different from the composition of the wire coating 60. For example, the encapsulant 80 may be an epoxy resin, a silicone material, or any other material commonly used as an encapsulant or in glob top applications. In the embodiment of FIG. 3C, the encapsulant 80 may cover not only the first and second microelectronic components 30 and 40, but also the bonding wires 38 and 48 and a portion of the contact surface 24 of the substrate 20 including the electrical contacts 26a–d. In one embodiment, the encapsulant is applied as a flowable material which is permitted to flow into and may substantially fill the intercomponent gap 52 between the first and second microelectronic components 30 and 40. So covering the active surface 34 of the first microelectronic component 30 and the facing surface 40 of the second microelectronic component 40 helps protect those surfaces and any active features exposed thereon from environmental damage. The layer of encapsulant 80 between the microelectronic components 30 and 40 may also help structurally strengthen the stacked microelectronic device so it may better withstand the rigors of use.

Figure 3D:
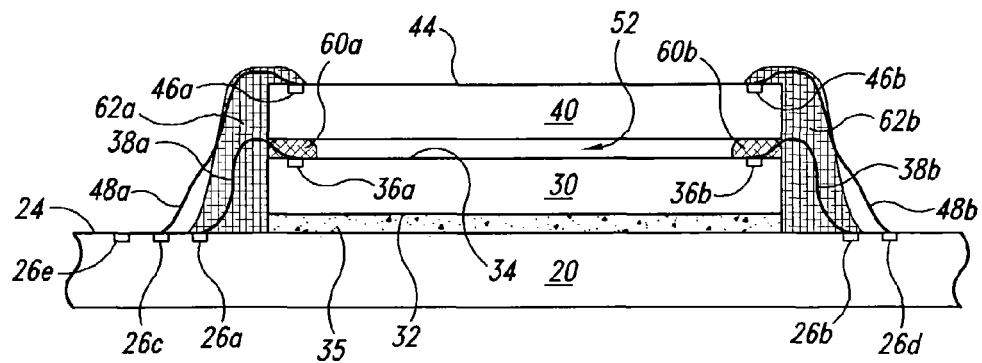
FIGS. 3D and 3E schematically illustrate sequential stages in a method of manufacturing a stacked microelectronic device including three microelectronic components in accordance with a further embodiment of the invention.
Figure 3E:
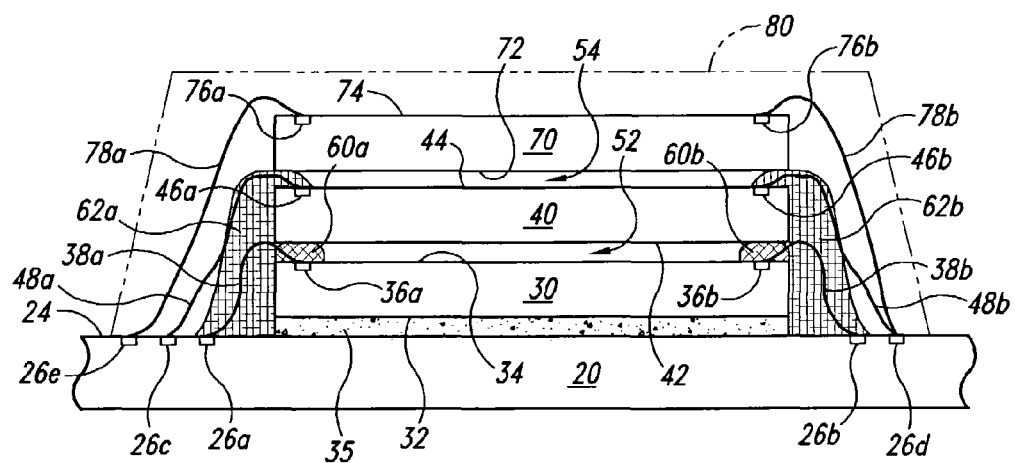

FIGS. 3D and 3E illustrate a further embodiment of the invention. Turning first to FIG. 3D, instead of encapsulating the structure shown in FIG. 3C with an encapsulant 80, a second wire coating 62 has been applied. In particular, a first wire coating segment 62a is applied over electrical contact 46a and a portion of the third bonding wire 48a. This wire coating segment 62a may also cover the previously exposed portion of the first bonding wire 38a and may also cover the electrical contact 26a to which the first bonding wire 38a is connected. In this embodiment, a portion of the third bonding wire 48a and the electrical contact 26c carried by the substrate 20 remain exposed, but these may be covered by the wire coating 62a if so desired. Similarly, the other wire coating segment 62b may enclose the electrical contact 46b carried by the microelectronic component 40 and a portion of the fourth bonding wire 48b, leaving exposed the remainder of the fourth bonding wire 48b and the other electrical contact 26d to which it is connected. The second wire coating 62 may be similar to the first wire coating 60 and have similar mechanical properties. In particular, the wire coating 62 may be a curable, thixotropic material which is capable of mechanically supporting another microelectronic component. In one embodiment of the invention, the two wire coatings 60 and 62 are formed of the same material, but they may be formed of different materials.

After the second wire coating 62 is applied, it may be partially cured to give it the desired mechanical properties. Thereafter, a third microelectronic component 70 may be brought into contact with the second wire coating 62. The second wire coating 62 may mechanically support the third microelectronic component 70 and mechanically bond the third microelectronic component 70 to the second microelectronic component 40. The third microelectronic component may have a mounting surface 72 which is spaced from the outer surface 44 of the second microelectronic component 40 by the second wire coating 62. This may define an open second intercomponent gap 54 between the second and third microelectronic components 40 and 70. The third microelectronic component 70 may have an outward surface 74 carrying a plurality of electrical contacts 76. In particular, electrical contact 76a may be electrically connected to electrical contact 26e carried by the substrate 20 via a fifth bonding wire 78a. Similarly, electrical contact 76b may be electrically connected to electrical contact 26d carried by the substrate 20 via a sixth bonding wire 78b. For purposes of illustration, this sixth bonding wire 78b is shown connected to the same electrical contact 26d to which the electrical contact 46b on the second microelectronic component is attached via the fourth bonding wire 48b. If so desired, the sixth bonding wire 78b could, instead, be attached to its own, separate electrical contact (not shown) on the substrate 20.

As explained above in connection with FIG. 3C, the three stacked microelectronic components 30, 40 and 70 may be encapsulated within an encapsulant 80. This encapsulant 80 may fill both of the intercomponent gaps 52 and 54.

Figure 4A:
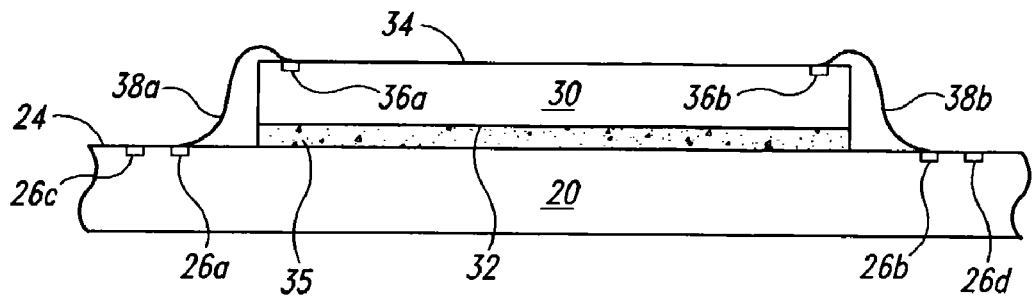
FIGS. 4A–4C schematically illustrate sequential stages in a method of manufacturing a stacked microelectronic device in accordance with an alternative embodiment of the invention.
Figure 4B:
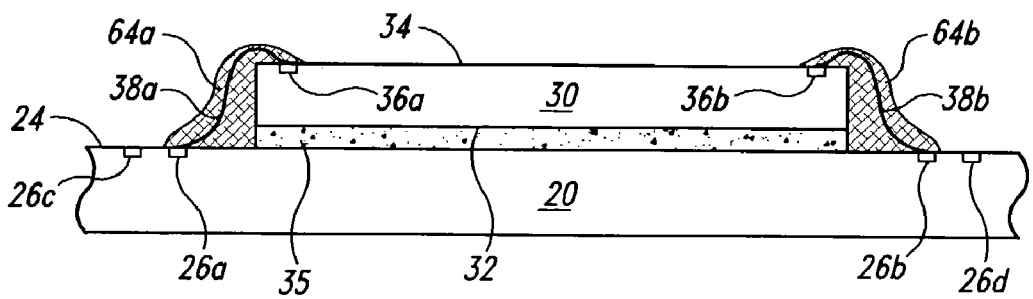
Figure 4C:
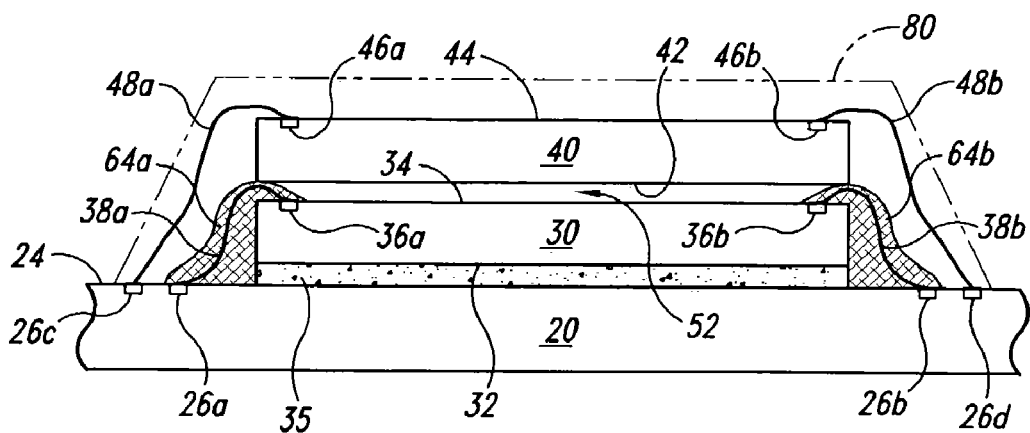

FIGS. 4A–4C schematically illustrate an alternate embodiment of the invention. The process schematically outlined in FIGS. 4A–4C is directly analogous to the process outlined above in connection with FIGS. 3A–3C. The primary distinction between the embodiment of FIGS. 4A–4C and the embodiment of FIGS. 3A–3C is the structure covered by the wire coating. In FIGS. 3B and 3C, the wire coating 60 covers the electrical contacts 36 carried by the first microelectronic component 30 and a portion of the first and second bonding wires 38a–b, but leaves exposed the remainder of these bonding wires and the associated electrical contacts 26a–b carried by the substrate 20. In the embodiment of FIGS. 4B and 4C, the wire coating 64 covers the entire length of the bonding wires and both of the electrical contacts to which each of the bonding wires is attached. In particular, the wire coating portion segment 64a covers the electrical contact 36a carried by the first microelectronic component 30, the first bonding wire 38a, and the electrical contact 26a carried by the substrate 20. Similarly, the wire coating segment 64b covers electrical contact 36b, the second bonding wire 38b, and electrical contact 26b.

The wire coating 64 may be partially cured, if so desired, and the second microelectronic component 40 may be brought into contact with the wire coating 64. The wire coating 64 will mechanically support the second microelectronic component 40 and may also mechanically bond the second microelectronic component 40 to the first microelectronic component 30. As shown in FIG. 4C, the first and second microelectronic components 30 and 40, the associated bonding wires 38 and 48 and the electrical contacts 26a–d may all be encapsulated within an encapsulant 80.

Figure 5A:
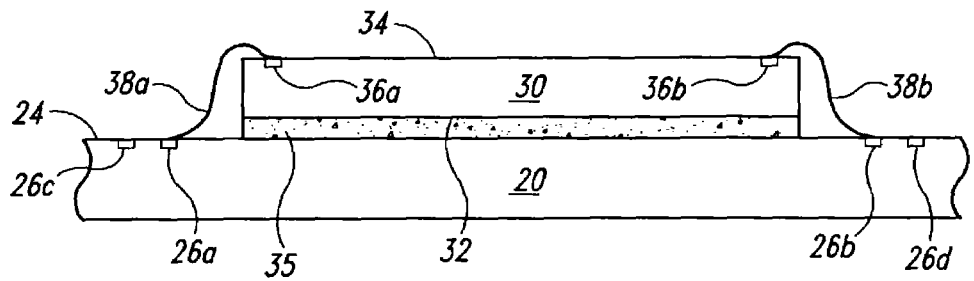
FIGS. 5A–5C schematically illustrate sequential stages in a method of manufacturing a stacked microelectronic device in accordance with still another embodiment of the invention.
Figure 5B:
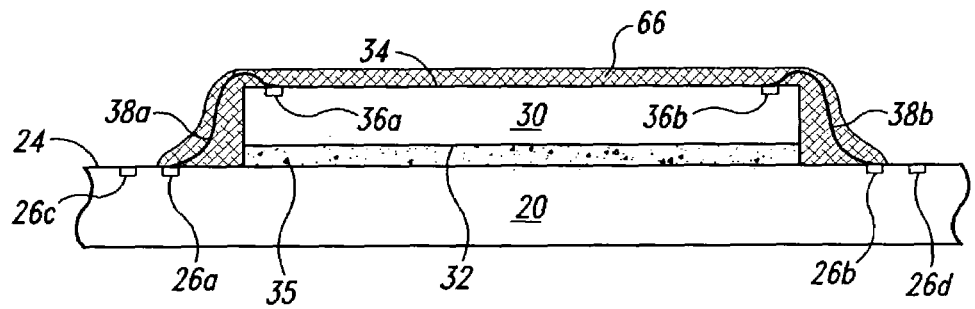
Figure 5C:
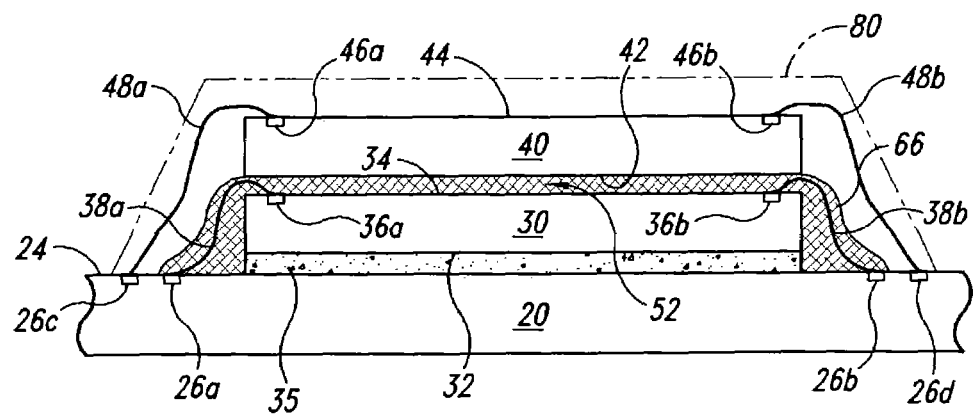

FIGS. 5A–5C illustrate another alternate embodiment of the invention. Again, the structure and process steps schematically shown in FIGS. 5A–5C are directly analogous to those shown in FIGS. 3A–3C, with the primary difference relating to the nature of the wire coating. In FIGS. 3A–3C, the wire coating 60 is applied in discrete wire coating portions 60a and 60b. In the embodiment of FIGS. 5B and 5C, a monolithic wire coating 66 may cover the entire active surface 34 of the first microelectronic component 30. This wire coating 66 may also cover the electrical contacts 36 carried by the active surface 34, as well as some or all of the length of the first and second bonding wires 38a and 38b. This monolithic wire coating 66 may be formed of the same types of materials as is the wire coating 60 of FIGS. 3B and 3C and may be partially cured before the second microelectronic component 40 is brought into contact therewith. By comparing FIG. 3C to FIG. 5C, it can be seen that there is no exposed intercomponent gap 52. Instead, the monolithic wire coating 66 substantially fills the space between the first microelectronic component 30 and the second microelectronic component 40. This can enhance the mechanical support of the second microelectronic component 40 and the mechanical bonding of the first and second microelectronic components 30 and 40.

Figure 6A:
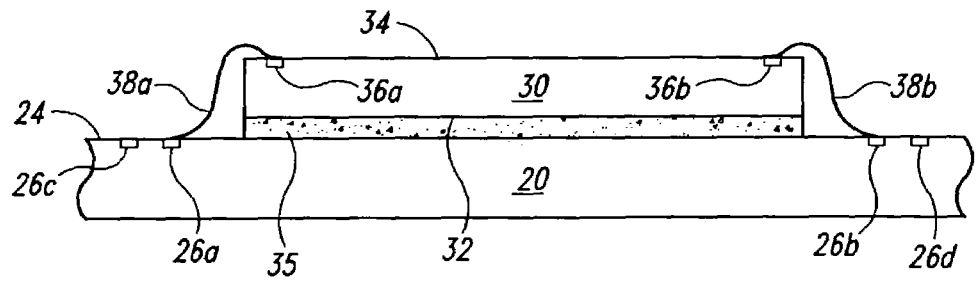
FIGS. 6A–6C schematically illustrate sequential stages in a method of manufacturing a stacked microelectronic device in accordance with yet another embodiment of the invention.
Figure 6B:
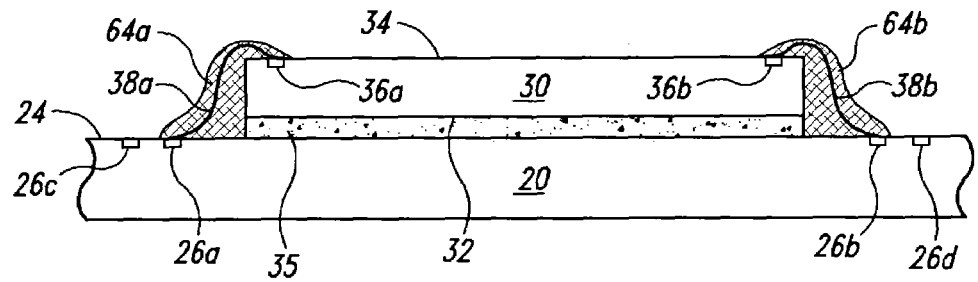
Figure 6C:
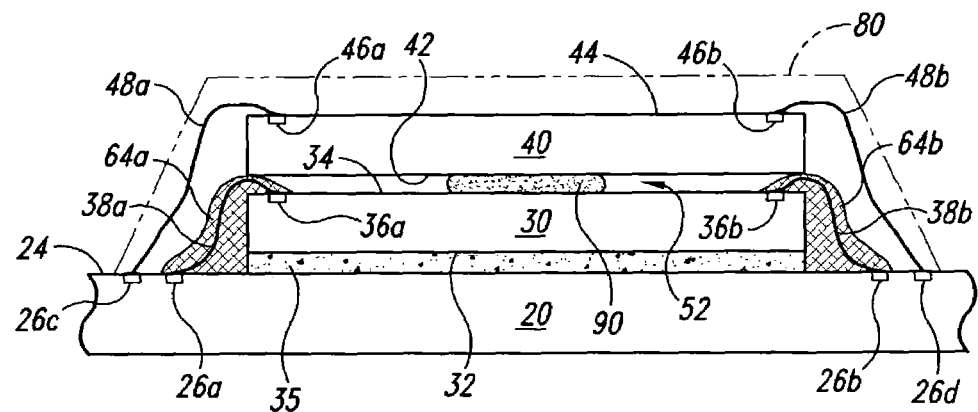

FIGS. 6A–6C illustrate yet another embodiment of the invention. This embodiment is directly analogous to the embodiment illustrated in FIGS. 4A–4C. As a matter of fact, the intermediate structure shown in FIG. 6B may be substantially identical to the intermediate structure shown in FIG. 4B, but FIG. 6C illustrates a modification of the process and structure shown in FIG. 4C. In the embodiment illustrated in 4B, the wire coating 64 is both mechanically stable and sufficiently tacky to adhere to the facing surface 42 of the second microelectronic component 40. If the wire coating 64 is deemed insufficiently adhesive to ensure adequate adhesion of the second microelectronic component 40, a pliable adhesive 90 may be positioned within the intercomponent gap 52. In the embodiment of FIG. 6C, the wire coating 64 provides mechanical support for the second microelectronic component 40 and the adhesive 90 may be readily deformable. As the second microelectronic component 40 is brought into mechanically supportive contact with the wire coating 64, the adhesive 90 may be squeezed between the active surface 34 of the first microelectronic component 30 and the facing surface 42 of the second microelectronic component 40. In FIG. 6C, a relatively small quantity of adhesive 90 is generally centered within the intercomponent gap 52. In an alternative embodiment (not shown), the adhesive substantially fills the intercomponent gap 52. After the second microelectronic component 40 is properly positioned, the adhesive 90 and/or wire coating 64 may be cured, if desired. An encapsulant 80 may also be employed to cover the first and second microelectronic components 30 and 40. If so desired, the encapsulant 80 may flow into the intercomponent gap 52 to fill those portions, if any, of the intercomponent gap 52 not already filled with the adhesive 90.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method of assembling a stacked microelectronic device assembly, comprising:
   attaching a first microelectronic component to a support, an active surface of the first microelectronic component facing away from a contact surface of the support, the support including a plurality of first electrical contacts and the first microelectronic component including a plurality of second electrical contacts;
   electrically connecting a first wire to a first one of the first electrical contacts and to a first one of the second electrical contacts, and electrically connecting a second wire to a second one of the first electrical contacts and to a second one of the second electrical contacts, the first wire being spaced from the second wire;
   disposing a wire coating on at least a portion of the first wire and at least a portion of the second wire;
   placing at least a portion of a second microelectronic component proximate to the active surface of the first microelectronic component such that the wire coating mechanically supports the second microelectronic component and defines an open intercomponent gap between a facing surface of the second microelectronic component and the active surface of the first microelectronic component; and
   wherein the wire coating is initially applied in an uncured state and is partially cured to yield an adhesive, mechanically stable wire coating prior to juxtaposing the facing surface of the second microelectronic component with the active surface of the first microelectronic component.

2. The method of claim 1 further comprising encapsulating the first and second microelectronic components in an encapsulant.

3. The method of claim 2 wherein the encapsulant is permitted to flow into the intercomponent gap.

4. The method of claim 1 further comprising electrically connecting a third wire to a third one of the first electrical contacts and to a third one of the second electrical contacts.

5. The method of claim 1 wherein the wire coating comprises a thixotropic material.

6. The method of claim 1 further comprising further curing the partially cured wire coating after the wire coating mechanically supports the second microelectronic component.

7. A method of assembling a stacked microelectronic device assembly, comprising:
   attaching a first microelectronic component to a support, the support including a plurality of first electrical contacts and the first microelectronic component including a plurality of second electrical contacts;
   electrically connecting a first one of the first electrical contacts to a first one of the second electrical contacts via a first bonding wire;
   electrically connecting a second one of the first electrical contacts to a second one of the second electrical contacts via a second bonding wire, the first one of the second electrical contacts being spaced from the second one of the second electrical contacts;
   coating at least a portion of the first bonding wire and at least a portion of the second bonding wire with a wire coating;
   partially curing the wire coating;
   contacting at least a portion of a second microelectronic component with the partially cured wire coating, thereby mechanically supporting the second microelectronic component with respect to the first microelectronic component and defining an intercomponent gap between the first and second microelectronic components; and electrically connecting a first one of a plurality of third electrical contacts carried by the second microelectronic component to a third one of the first electrical contacts.

8. The method of claim 7 wherein the second microelectronic component has a facing surface including a peripheral portion and a central portion bounded by the peripheral portion; the peripheral portion of the facing surface contacting the coating; the central portion overlying the intercomponent gap and remaining exposed when electrically connecting a first one of the third electrical contacts to a third one of the first electrical contacts.

9. The method of claim 8 further comprising encapsulating the first and second microelectronic components in an encapsulant and permitting the encapsulant to flow into the intercomponent gap and into contact with the central portion of the facing surface of the second microelectronic component.

10. The method of claim 7 further comprising encapsulating the first and second microelectronic components in an encapsulant.

11. The method of claim 10 wherein the encapsulant is permitted to flow into the intercomponent gap.

12. The method of claim 7 wherein the wire coating comprises a thixotropic material.

13. The method of claim 7 wherein the wire coating is initially applied in an uncured state and the partial curing yields an adhesive, mechanically stable wire coating prior to bringing the second microelectronic component into contact with the wire coating.

14. The method of claim 7 further comprising further curing the partially cured wire coating after bringing the second microelectronic component into contact with the wire coating.

15. A method of assembling a stacked microelectronic device assembly, comprising:

attaching a first microelectronic component to a support;
wire bonding a first electrical contact carried by the support to a second electrical contact carried by the first microelectronic component using a first bonding wire;
covering at least a portion of the first bonding wire with a wire coating, the wire coating having an exposed upper surface;
contacting the upper surface of the wire coating with a second microelectronic component, the wire coating mechanically bonding the second microelectronic component to the first microelectronic component and defining an intercomponent gap between the first and second microelectronic components;
electrically connecting a third electrical contact carried by the second microelectronic component to a fourth electrical contact carried by the support;
after defining the intercomponent gap, introducing a second material into the intercomponent gap; and
partially curing the wire coating before contacting the wire coating with the second microelectronic component.

16. The method of claim 15 wherein the support includes a plurality of first electrical contacts and the first microelectronic component carries a plurality of second electrical contacts, the first bonding wire being electrically connected to a first one of the first electrical contacts and to a first one of the second electrical contacts.

17. The method of claim 16 further comprising wire bonding a second one of the first electrical contacts to a second one of the second electrical contacts using a second bonding wire, the first bonding wire being spaced from the second bonding wire.

18. The method of claim 17 further comprising covering at least a portion of the second bonding wire with the wire coating.

19. The method of claim 18 wherein the wire coating is applied as a plurality of discrete coatings, a first of the discrete coatings covering the portion of the first bonding wire and a second of the discrete coatings covering the portion of the second bonding wire.

20. The method of claim 15 wherein partially curing the wire coating yields an adhesive, mechanically stable coating.

21. The method of claim 15 further comprising further curing the partially cured wire coating after contacting the wire coating with the second microelectronic component.

22. The method of claim 15 wherein the wire coating contacts a peripheral portion of a facing surface of the second component, a central portion of the facing surface being exposed to the intercomponent gap.

23. The method of claim 22 wherein the second material contacts the central portion of the facing surface.

24. The method of claim 15 wherein the second material comprises an encapsulant having a composition which differs from a composition of the wire coating.

25. The method of claim 15 wherein introducing the second material into the intercomponent gap further comprises encapsulating the first and second components in the second material.

26. The method of claim 25 wherein the second material has a composition which differs from a composition of the wire coating.

27. The method of claim 15 wherein the wire coating is initially applied as a curable thixotropic coating, the method further comprising at least partially curing the thixotropic coating.

28. A method of assembling a stacked microelectronic device assembly including a support, a first microelectronic component, and a second microelectronic component; the support carrying a plurality of first electrical contacts, the first microelectronic component carrying a plurality of second electrical contacts, and the second microelectronic component carrying a plurality of third electrical contacts, the method comprising:

attaching the first microelectronic component to the substrate and electrically connecting one of the first electrical contacts to one of the second electrical contacts via a first bonding wire;
coating at least a portion of the first bonding wire with a first curable coating;
partially curing the first curable coating, yielding an adhesive, mechanically stable coating;
contacting at least a portion of the second microelectronic component with the adhesive, mechanically stable coating, thereby mechanically supporting the second microelectronic component with respect to the first microelectronic component; and
electrically connecting one of the third electrical contacts to one of the first electrical contacts.

29. The method of claim 28 further comprising further curing the adhesive, mechanically stable coating after the second microelectronic component is mechanically supported.

30. The method of claim 28 wherein the second microelectronic component has a facing surface including a peripheral portion and a central portion bounded by the peripheral portion; the peripheral portion of the facing surface contacting the coating; the central portion remaining exposed when electrically connecting a third one of the first electrical contacts to a third one of the second electrical contacts.

31. The method of claim 30 further comprising encapsulating the first and second microelectronic components in an encapsulant and permitting the encapsulant to flow into contact with the central portion of the facing surface of the second microelectronic component.

32. The method of claim 28 further comprising encapsulating the first and second microelectronic components in an encapsulant.

33. The method of claim 32 wherein the encapsulant is permitted to flow into an intercomponent gap between the first and second microelectronic components.

34. The method of claim 28 wherein the wire coating comprises a thixotropic material.

35. A method of assembling a stacked microelectronic device assembly, comprising:
   attaching a first microelectronic component to a support, an active surface of the first microelectronic component facing away from a contact surface of the support, the support including a plurality of first electrical contacts and the first microelectronic component including a plurality of second electrical contacts;
   electrically connecting a first wire to a first one of the first electrical contacts and to a first one of the second electrical contacts, the first wire having a length between the first one of the first electrical contacts and the first one of the second electrical contacts;
   covering the length of the first wire with a wire coating;
   thereafter, juxtaposing a facing surface of a second microelectronic component with the active surface of the first microelectronic component such that the wire coating mechanically supports the second microelectronic component with the facing surface spaced from the active surface to define an open intercomponent gap; and
   wherein the wire coating is initially applied in an uncured state and is partially cured to yield an adhesive, mechanically stable wire coating prior to juxtaposing the facing surface of the second microelectronic component with the active surface of the first microelectronic component.

36. The method of claim 35 further comprising introducing an encapsulant material into the intercomponent gap.

37. A method of assembling a stacked microelectronic device assembly, comprising:
   attaching a first microelectronic component to a support, the support including a plurality of first electrical contacts and the first microelectronic component including a plurality of second electrical contacts;
   electrically connecting a first wire to a first one of the first electrical contacts and to a first one of the second electrical contacts;
   coating at least a portion of the first wire with a curable coating;
   partially curing the curable coating, yielding an adhesive, mechanically stable coating;
   placing at least a portion of a second microelectronic component proximate to the active surface of the first microelectronic component such that the adhesive, mechanically stable coating mechanically supports the second microelectronic component and defines an intercomponent gap between a facing surface of the second microelectronic component and the active surface of the first microelectronic component;
   electrically connecting a second wire to one of the second electrical contacts and to a third electrical contact carried by the second microelectronic component; and
   encapsulating the first and second microelectronic components in an encapsulant so that the encapsulant substantially fills the intercomponent gap and covers the second wire.

38. A method of assembling a stacked microelectronic device assembly, comprising:
   attaching a first microelectronic component to a support;
   electrically connecting the support to the first microelectronic component using a bonding wire;
   disposing a mechanically stable wire coating on at least a portion of the bonding wire;
   depositing a quantity of an adhesive on a face of the first microelectronic component;
   contacting upper surfaces of the wire coating and the adhesive with a facing surface of a second microelectronic component, the wire coating and the adhesive mechanically supporting and bonding the second microelectronic component to the first microelectronic component and leaving a portion of the facing surface exposed;
   electrically connecting the second microelectronic component to the substrate; and
   introducing an encapsulant material between the first and second microelectronic components to cover the exposed portion of the facing surface.

* * * * *